(12) United States Patent  
Seo et al.

(10) Patent No.: US 12,200,937 B2
(45) Date of Patent: Jan. 14, 2025

(54) SEMICONDUCTOR DEVICE AND METHOD OF MANUFACTURING SEMICONDUCTOR DEVICE

(71) Applicant: SK hynix Inc., Icheon-si (KR)

(72) Inventors: Moon Sik Seo, Icheon-si (KR); Dae Hwan Yun, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/503,809

(22) Filed: Nov. 7, 2023

(65) Prior Publication Data

US 2024/0074198 A1  Feb. 29, 2024

Related U.S. Application Data

(62) Division of application No. 17/373,142, filed on Jul. 12, 2021, now Pat. No. 11,849,583.

(30) Foreign Application Priority Data

Feb. 5, 2021  (KR) .................. 10-2021-0017031

(51) Int. Cl.
| | |
|---|---|
| H10B 43/27 | (2023.01) |
| H01L 21/02 | (2006.01) |
| H01L 21/28 | (2006.01) |
| H10B 41/27 | (2023.01) |
| H10B 63/00 | (2023.01) |
| H10N 70/00 | (2023.01) |

(52) U.S. Cl.
CPC .......... *H10B 43/27* (2023.02); *H01L 21/0214* (2013.01); *H01L 21/02164* (2013.01); *H01L 21/0223* (2013.01); *H01L 29/40114* (2019.08); *H01L 29/40117* (2019.08); *H10B 41/27* (2023.02); *H10B 63/34* (2023.02); *H10B 63/845* (2023.02); *H10N 70/041* (2023.02); *H10N 70/066* (2023.02)

(58) Field of Classification Search
CPC ........ H10B 43/27; H10B 41/27; H10B 63/34; H10B 63/845; H01L 29/40114; H01L 29/40117; H10N 70/041
See application file for complete search history.

(56) References Cited

U.S. PATENT DOCUMENTS 10,177,227 B1  1/2019  Yoshida et al.

FOREIGN PATENT DOCUMENTS

| KR | 1020130092341 A | 8/2013 |
|---|---|---|
| KR | 1020140022204 A | 2/2014 |
| KR | 101756227 B1 | 7/2017 |

*Primary Examiner* — Samuel A Gebremariam
(74) *Attorney, Agent, or Firm* — WILLIAM PARK & ASSOCIATES LTD.

(57) ABSTRACT

A method of manufacturing a semiconductor device may include forming a stack with alternately stacked first material layers and second material layers, forming an opening passing through the stack, forming a memory layer in the opening, forming a slit passing through the stack and exposing the first material layers and the second material layers, and forming first barrier patterns, without removing the second material layers, by partially oxidizing the memory layer through the second material layers.

6 Claims, 15 Drawing Sheets

SEMICONDUCTOR DEVICE AND METHOD OF MANUFACTURING SEMICONDUCTOR DEVICE

CROSS-REFERENCE TO RELATED APPLICATION

The present application is a divisional application of U.S. patent application Ser. No. 17/373,142, filed on Jul. 12, 2021, and claims priority under 35 U.S.C. § 119(a) to Korean patent application number 10-2021-0017031 filed on Feb. 5, 2021, in the Korean Intellectual Property Office, the entire disclosure of which is incorporated by reference herein.

BACKGROUND

1. Technical Field

The present disclosure relates to an electronic device, and more particularly, to a semiconductor device and a method of manufacturing the semiconductor device.

2. Related Art

An integration degree of a semiconductor device is mainly determined by the area that is occupied by a unit memory cell. Recently, as the integration degree of a semiconductor device that forms a memory cell in a single layer on a substrate reaches a limit, a three-dimensional semiconductor device in which memory cells are stacked on a substrate is being proposed. In addition, in order to improve operation reliability of the semiconductor device, various structures and manufacturing methods are being developed.

SUMMARY

According to an embodiment of the present disclosure, a method of manufacturing a semiconductor device may include forming a stack with alternately stacked first material layers and second material layers, forming an opening passing through the stack, forming a memory layer in the opening, forming a slit passing through the stack and exposing the first material layers and the second material layers, and forming first barrier patterns, without removing the second material layers, by partially oxidizing the memory layer through the second material layers.

According to an embodiment of the present disclosure, a semiconductor device may include a gate structure with alternately stacked conductive layers and insulating layers, a channel layer passing through the gate structure, a memory layer positioned between the channel layer and the conductive layers, and barrier patterns positioned between the channel layer and the insulating layers and separated from each other by the memory layer, and each of the barrier patterns may include a sidewall facing the memory layer, and the sidewall includes a curved surface.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application.

An embodiment of the present disclosure provides a semiconductor device with a stable structure and an improved characteristic, and a method of manufacturing the semiconductor device.

An integration degree of a semiconductor device may be improved by stacking memory cells in a three dimension. In addition, a semiconductor device with a stable structure and improved reliability may be provided.

Figure 1A:
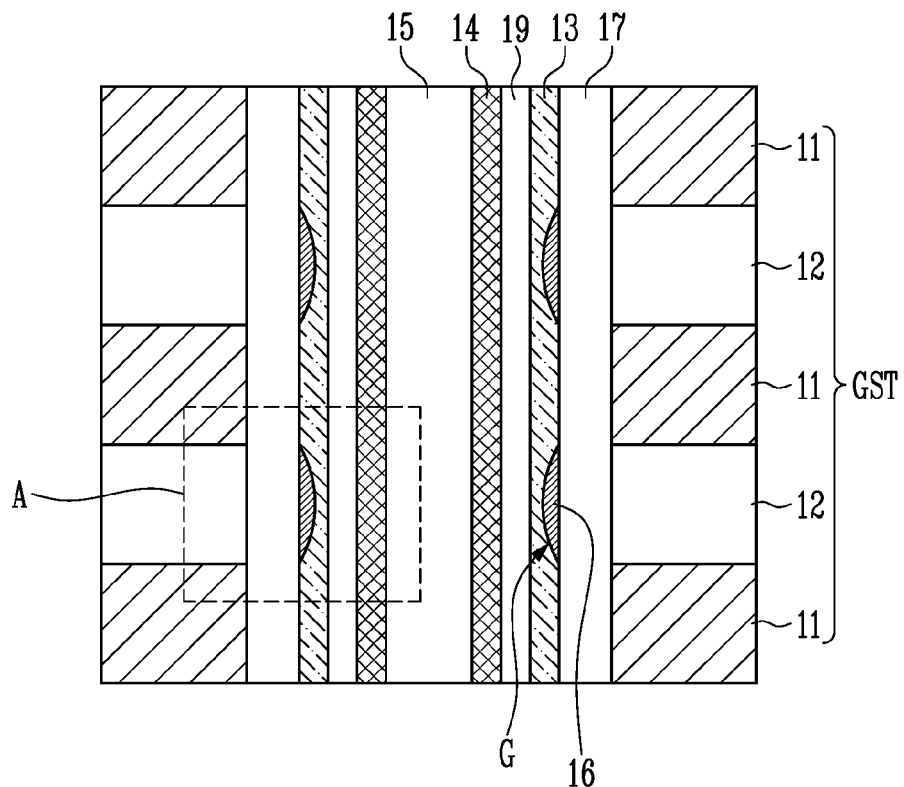
FIGS. 1A and 1B are diagrams illustrating a structure of a semiconductor device according to an embodiment of the present disclosure.
Figure 1B:
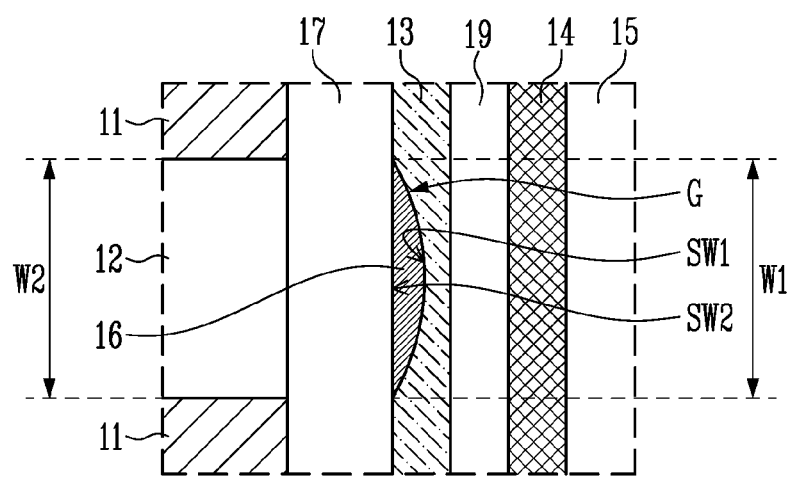

FIGS. 1A and 1B are diagrams illustrating a structure of a semiconductor device according to an embodiment of the present disclosure. FIG. 1B is an enlarged view of a region A of FIG. 1A.

Referring to FIG. 1A, the semiconductor device may include a gate structure GST, a memory layer 13, and barrier patterns 16. The semiconductor device may further include a channel layer 14, an insulating core 15, a blocking layer 17, a tunnel insulating layer 19, or a combination thereof.

The gate structure GST may include conductive layers 11 and insulating layers 12 that are alternately stacked. The conductive layers 11 may be gate electrodes of a memory cell, a select transistor, and the like. The conductive layers 11 may include a conductive material, such as polysilicon, tungsten, molybdenum, or metal. The insulating layers 12 may be insulating the stacked conductive layers 11 from each other. The insulating layers 12 may include an insulating material, such as oxide, nitride, and an air gap.

The channel layer 14 may pass through the gate structure GST. The channel layer 14 may extend in a stack direction of the conductive layers 11 and the insulating layers 12. The channel layer 14 may be a region in which a channel of the memory cell, the select transistor, or the like is formed. The channel layer 14 may include a semiconductor material. As an example, the channel layer 14 may include silicon, germanium, nanostructure, or the like. For reference, the semiconductor device may include a conductive layer instead of the channel layer 14. The conductive layer may be an electrode layer, a vertical bit line, or the like.

The insulating core 15 may be formed in the channel layer 14. The insulating core 15 may have a structure with a single layer or multiple layers. The insulating core 15 may include an insulating material, such as oxide, nitride, and an air gap. As an example, the insulating core 15 may be omitted, and the channel layer 14 may be filled to a center.

The memory layer 13 may pass through the gate structure GST. The memory layer 13 may be formed to surround the channel layer 14. The memory layer 13 may be positioned between the channel layer 14 and the conductive layers 11, and the memory layer 13 may extend between the channel layer 14 and the barrier patterns 16. The memory layer 13 may include a floating gate, a charge trap material, polysilicon, nitride, a variable resistance material, a phase change material, or the like, or may include a combination thereof.

The memory layer 13 may include grooves G on a sidewall. The grooves G may be positioned to correspond with the insulating layers 12, respectively. The grooves G may surround the barrier patterns 16, respectively. Each of the grooves G may include a curved surface. The memory layer 13 may include an inner wall that faces the channel layer 14 and an outer wall that faces the gate structure GST, and the grooves G may be positioned on the outer wall.

The tunnel insulating layer 19 may be positioned between the channel layer 14 and the memory layer 13. The tunnel insulating layer 19 may be formed to surround a sidewall of the channel layer 14. The tunnel insulating layer 19 may include oxide.

The blocking layer 17 may be positioned between the memory layer 13 and the conductive layers 11. The blocking layer 17 may be formed to surround the memory layer 13. As an embodiment, the blocking layer 17 may be formed to surround the memory layer 13 and the barrier patterns 16 and may extend in the stack direction. As an embodiment, the semiconductor device may include blocking patterns instead of the blocking layer 17. The blocking patterns may be positioned between the memory layer 13 and the conductive layers 11 and between the conductive layers 11 and the insulating layers 12. Each of the blocking patterns may have a C-shaped cross section.

The barrier patterns 16 may provide an energy barrier for limiting a charge transferal in the memory layer 13. The barrier patterns 16 may be positioned to correspond with the insulating layers 12, respectively. Therefore, the transferal of the charge in a portion of the memory layer 13 that corresponds with the insulating layers 12 may be limited.

The barrier patterns 16 may be positioned between the insulating layers 12 and the memory layer 13 or between the memory layer 13 and the blocking layer 17. The barrier patterns 16 may be separated from each other and may be spaced apart from each other in the stack direction.

Referring to FIGS. 1A and 1B, each of the barrier patterns 16 may include a first sidewall SW1 that faces the memory layer 13. The first sidewall SW1 may include a curved surface. The first sidewall SW1 may be in contact with the groove G. Each of the barrier patterns 16 may include a second sidewall SW2 that faces the insulating layers 12. The second sidewall SW2 may be flat. Each of the barrier patterns 16 may have a first width W1, and each of the insulating layers 12 may have a second width W2. The first width W1 may be the same as or may be different from the second width W2.

The barrier patterns 16 may include oxide. As an example, the barrier patterns 16 may include a material that is obtained by oxidizing the memory layer 13. The barrier patterns 16 may include silicon nitride oxide, silicon oxide, or a combination thereof.

According to the structure as described above, the memory cell or the select transistor may be positioned at a portion in which the channel layer 14 and the conductive layers 11 cross each other. The stacked memory cells may share the memory layer 13. A space area may be defined between the stacked memory cells, and the barrier patterns 16 may be positioned in the space area. Therefore, the charge may be prevented or reduced from transferring between the stacked memory cells by increasing the energy barrier of the space area by the barrier patterns 16.

Figure 2A:
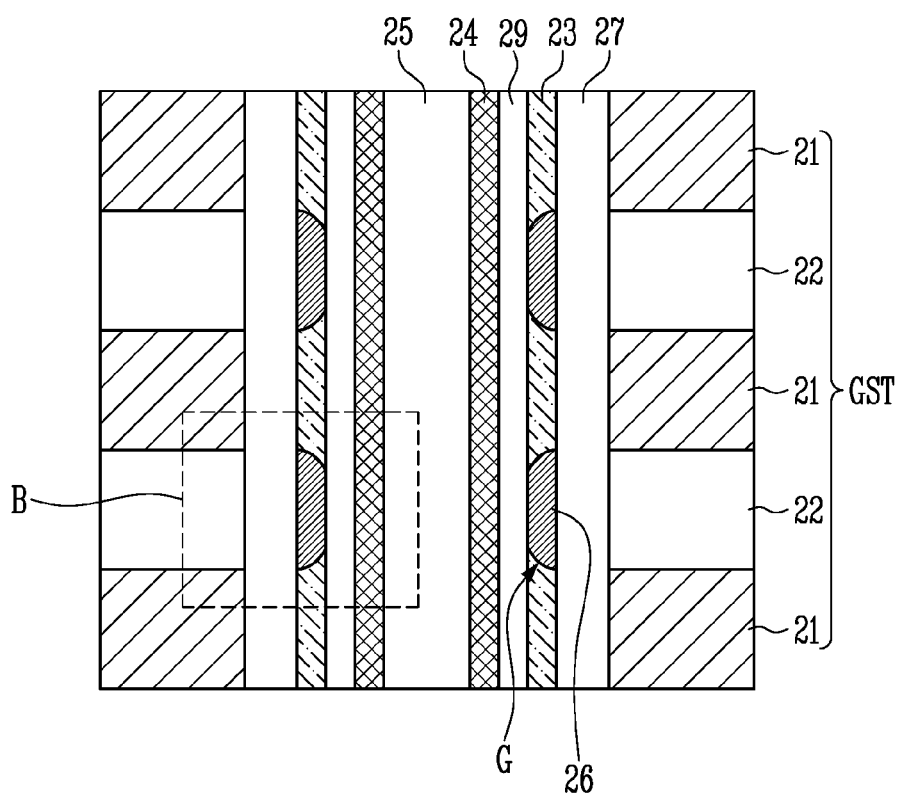
FIGS. 2A and 2B are diagrams illustrating a structure of a semiconductor device according to an embodiment of the present disclosure.
Figure 2B:
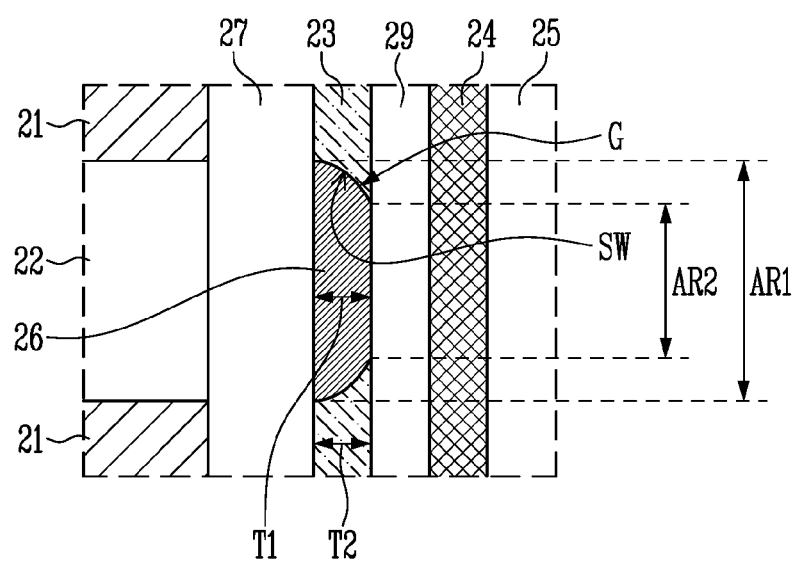

FIGS. 2A and 2B are diagrams illustrating a structure of a semiconductor device according to an embodiment of the present disclosure. Hereinafter, the content repetitive to the previously described content is omitted.

Referring to FIG. 2A, the semiconductor device may include a gate structure GST, memory patterns 23, and barrier patterns 26. The semiconductor device may further include a channel layer 24, an insulating core 25, a blocking layer 27, a tunnel insulating layer 29, or a combination thereof.

The gate structure GST may include conductive layers 21 and insulating layers 22 that are alternately stacked. The channel layer 24 may pass through the gate structure GST. The insulating core 25 may be formed in the channel layer 24.

The memory patterns 23 may be formed to surround the channel layer 24. The memory patterns 23 may be separated from each other by the barrier patterns 26. The memory patterns 23 may include a floating gate, a charge trap material, polysilicon, nitride, a variable resistance material, a phase change material, or the like, or may include a combination thereof.

The tunnel insulating layer 29 may be positioned between the channel layer 24 and the memory patterns 23 and between the channel layer 24 and the barrier patterns 26. Each of the memory patterns 23 may include a sidewall that faces the barrier patterns 26 and may include a groove G on the sidewall.

The blocking layer 27 may be positioned between the memory patterns 23 and the conductive layers 21. The blocking layer 27 may be formed to surround the memory patterns 23 and the barrier patterns 26.

The barrier patterns 26 may limit a charge transferal between the memory patterns 23. The barrier patterns 26 may be positioned between the blocking layer 27 and the tunnel insulating layer 29. The barrier patterns 26 may be separated from each other by the memory patterns 23.

Referring to FIGS. 2A and 2B, each of the barrier patterns 26 may include a sidewall SW that faces the memory patterns 23. The sidewall SW may include a curved surface. The sidewall SW may be in touch with the groove G. The barrier pattern 26 may face or contact the blocking layer 27 or the insulating layer 22 at the first area AR1. The barrier pattern 26 may face or contact the tunnel insulating layer 29 or the channel layer 24 at the second area AR2. The first area AR1 and the second area AR2 may be the same or may be different. As an embodiment, the first area AR1 may be greater than the second area AR2.

According to the structure as described above, a memory cell or a select transistor may be positioned at a portion in which the channel layer 24 and the conductive layers 21 cross each other. Each of the stacked memory cells may include the memory patterns 23, and the barrier patterns 26 may be positioned between the stacked memory cells.

Therefore, the charge may be prevented or reduced from transferring between stacked memory cells.

Figure 3A:
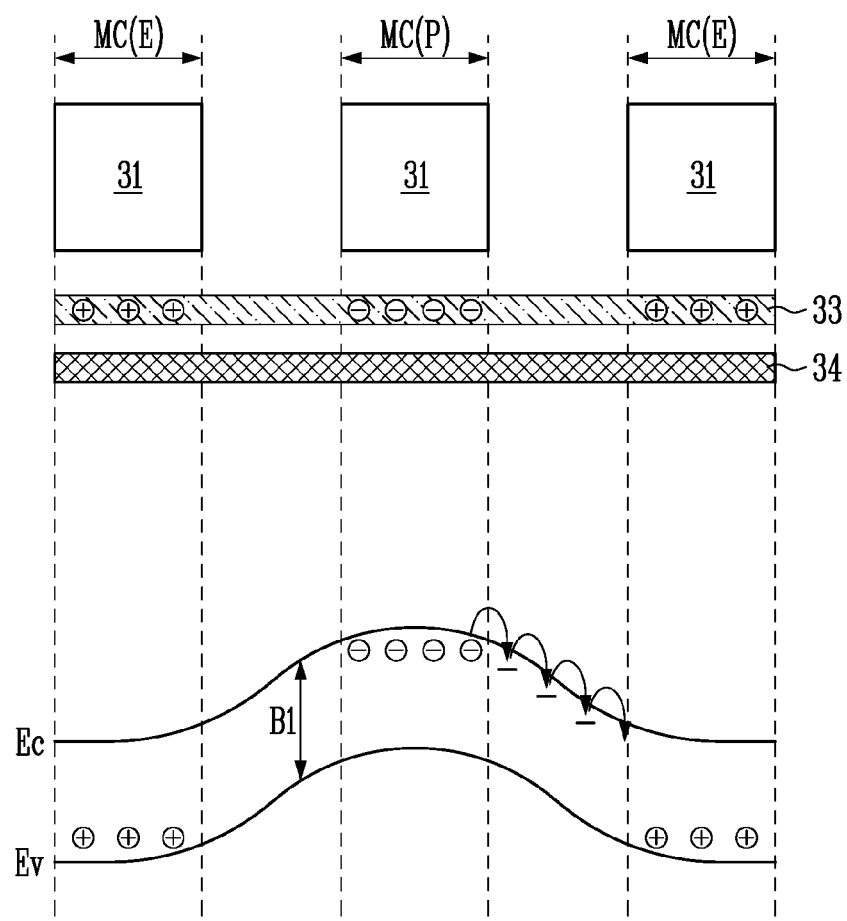
FIGS. 3A and 3B are diagrams illustrating an operation principle of a semiconductor device according to an embodiment of the present disclosure.
Figure 3B:
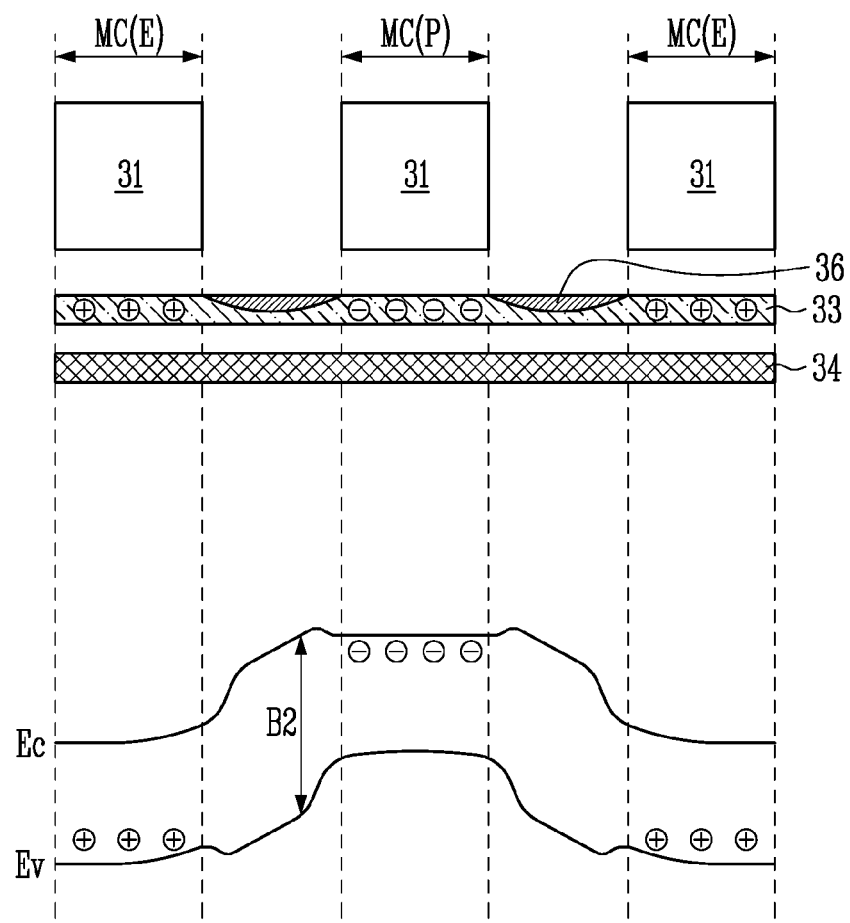

FIGS. 3A and 3B are diagrams illustrating an operation principle of a semiconductor device according to an embodiment of the present disclosure. Hereinafter, the content that is repetitive to the previously described content is omitted.

Referring to FIGS. 3A and 3B, each of memory cells MC may include a channel layer 34, a memory layer 33, and a gate electrode 31. The memory cells MC may be horizontally arranged on a substrate or may be stacked on the substrate.

During the program operation, the selected memory cell MC may be programmed by injecting a charge into the memory layer 33 from the channel layer 34. During an erase operation, the memory cell MC may be erased by discharging a charge from the memory layer 33 to the channel layer 34 or by injecting a hole from the channel layer 34 into the memory layer 33.

Referring to FIG. 3A, the memory cells MC may share the memory layer 33. As an embodiment, the memory layer 33 may include silicon nitride ($Si_3N_4$) and may have a band gap energy B1 of about 5 eV. Here, the band gap energy may be a difference between an energy level of a conduction band (Ec) and an energy level of a valence band (Ev). In a space area between the memory cells MC, the memory layer 33 might not have an energy barrier sufficient to block a charge transferal between the memory cells MC. Therefore, a charge may be transferred from a programmed memory cell MC_P to an erased memory cell MC_E.

Referring to FIG. 3B, a barrier pattern 36 may exist for each space area. As an embodiment, the barrier patterns 36 may include silicon oxide ($SiO_2$) or silicon oxynitride (SiON) and may have a band gap energy B2 of about 8 eV. In the space area, the barrier patterns 36 may provide an energy barrier that is sufficient to prevent or reduce the charge transferal between the memory cells MC. Therefore, the transferal of the charge from the programmed memory cell MC_P to the erased memory cell MC_E may be prevented or reduced.

Meanwhile, in the present embodiment, a case in which the memory cells MC share the memory layer 33 is described, but as described above with reference to FIGS. 2A and 2B, each of the memory cells MC may include the memory patterns.

FIGS. 4A to 4D are diagrams illustrating a method of manufacturing a semiconductor device according to an embodiment of the present disclosure. Hereinafter, the content repetitive to the previously described content is omitted.

Figure 4A:
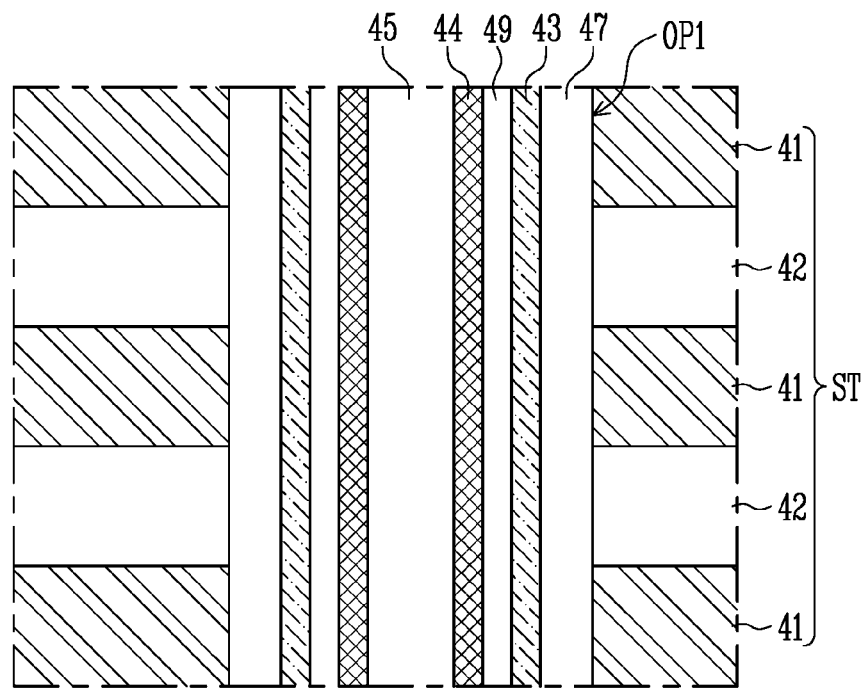
FIGS. 4A to 4D are diagrams illustrating a method of manufacturing a semiconductor device according to an embodiment of the present disclosure.

Referring to FIG. 4A, a stack ST may be formed. The stack ST may include first material layers 41 and second material layers 42 that are alternately stacked. The first material layers 41 may include a material with a high etching selectivity with respect to the second material layers 42. For example, the first material layers 41 may include a sacrificial material, such as nitride, and the second material layers 42 may include an insulating material, such as oxide. As another example, the first material layers 41 may include a conductive material, such as polysilicon, tungsten, and molybdenum, and the second material layers 42 may include an insulating material, such as oxide.

Subsequently, a first opening OP1 that passes through the stack ST may be formed. The first opening OP1 may have a plane of a circle, an ellipse, a polygon, or the like. As an embodiment, a plurality of first openings OP1 that are arranged in a first direction and a second direction, crossing the first direction, may be formed.

Subsequently, a memory layer 43 may be formed in the first opening OP1. The memory layer 43 may include a floating gate, a charge trap material, polysilicon, nitride, a variable resistance material, a phase change material, a nano structure, and the like. Subsequently, a channel layer 44 may be formed in the memory layer 43. A conductive layer may also be formed instead of the channel layer 44. Subsequently, an insulating core 45 may be formed in the channel layer 44.

For reference, before forming the memory layer 43, a blocking layer 47 may be further formed. Before the channel layer 44 is formed, a tunnel insulating layer 49 may be further formed. As an embodiment, the blocking layer 47 may be formed in the first opening OP1, the memory layer 43 may be formed in the blocking layer 47, the tunnel insulating layer 49 may be formed in the memory layer 43, the channel layer 44 may be formed in the tunnel insulating layer 49, and the insulating core 45 may be formed in the channel layer 44.

Figure 4B:
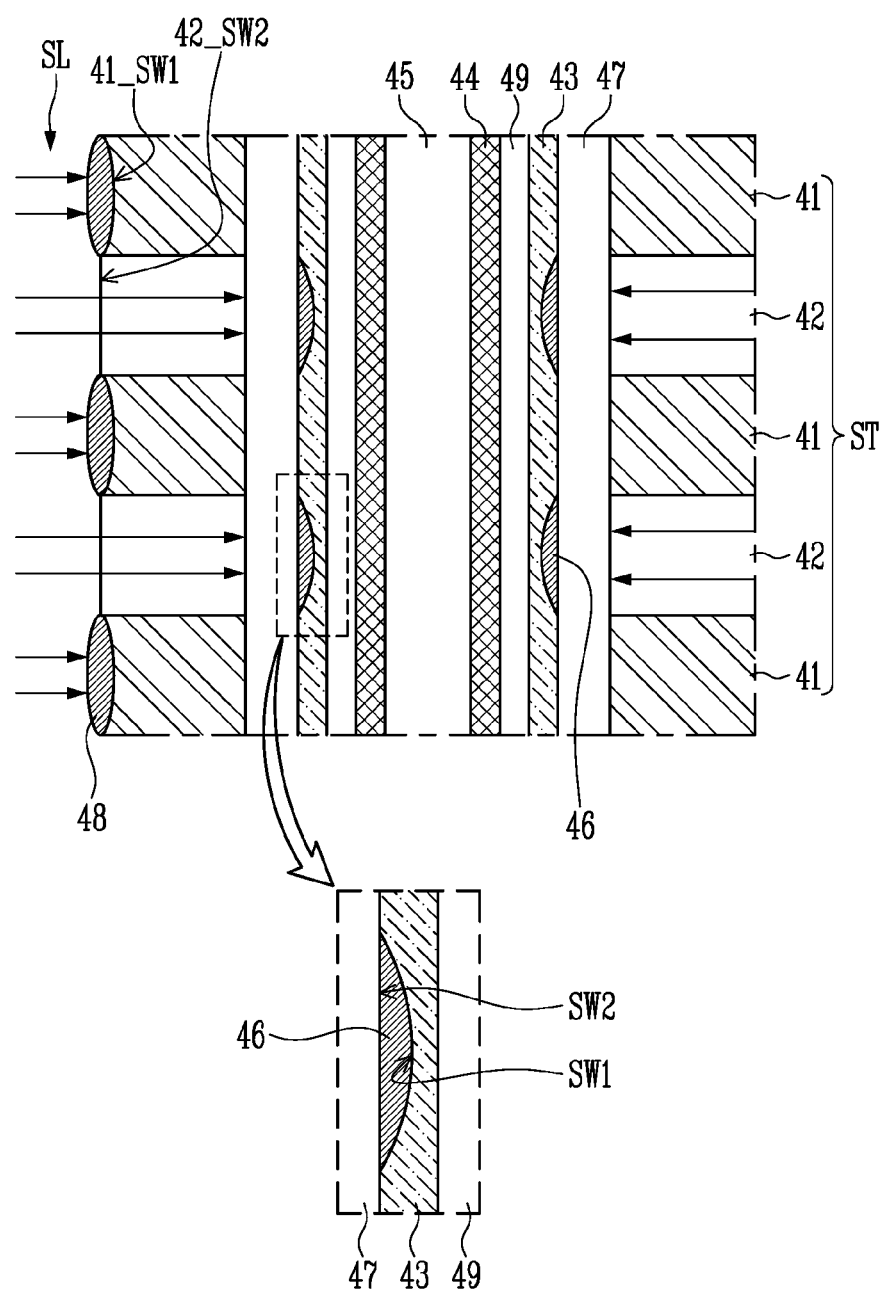

Referring to FIG. 4B, a slit SL that passes through the stack may be formed. The slit SL may be formed at a depth, passing through the first material layers 41. Sidewalls 41_SW1 of the first material layers 41 and sidewalls 42_SW2 of the second material layers 42 may be exposed by the slit SL.

Subsequently, the memory layer 43 may be partially oxidized to form first barrier patterns 46. An oxidation process may be performed by supplying an oxygen source gas through the slit SL. Since the memory layer 43 is not exposed through the slit SL, the oxygen source gas may permeate through the second material layers 42 to oxidize the memory layer 43. The oxygen source gas may include $H_2O$ gas, $O_2$ gas, $N_2O$ gas, NO gas, or a combination thereof.

The first barrier patterns 46 may include a material that is obtained by oxidizing the memory layer 43. As an example, the memory layer 43 may include silicon nitride, and the first barrier patterns 46 may include a material that is obtained by oxidizing silicon nitride. The first barrier patterns 46 may include silicon nitride oxide. Alternatively, the first barrier patterns 46 with silicon oxide may be formed by increasing an oxidation rate of the memory layer 43. The first barrier patterns 46 may include a combination of silicon nitride oxide and silicon oxide.

The oxidation process may be performed while the first material layers 41 and the second material layers 42 remain. During the oxidation process, a reaction rate between the second material layers 42 and the oxygen source gas may be different from a reaction rate between the first material layers 41 and the oxygen source gas. Therefore, the oxygen source gas may be selectively supplied through the second material layers 42 by using the reaction rate difference.

During the oxidation process, the second material layers 42 might not react with the oxygen source gas or may have a reaction rate with the oxygen source gas that is lower than that of the first material layers 41. Therefore, the oxygen source gas may permeate into the second material layers 42 through the sidewalls 42_SW2 and may reach the memory layer 43. When the blocking layer 47 exists in the first opening OP1, the oxygen source gas may permeate into the second material layers 42 and the blocking layer 47 and may reach the memory layer 43. Therefore, portions of the memory layer 43 that correspond to the second material layers 42 may be selectively oxidized, and the first barrier patterns 46 may be formed.

During the oxidation process, the first material layers 41 may react with the oxygen source gas and may have a reaction rate with the oxygen source gas that is higher than that of the second material layers 42. The oxygen source gas that is supplied through the slit SL may react with the first sidewalls 41_SW1, the first sidewalls 41_SW1 may be oxidized, and thus, the second barrier patterns 48 may be formed. The second barrier patterns 48 may block the permeation of the oxygen source gas into the first material layers 41 or may reduce the permeation rate. The second barrier patterns 48 may include silicon nitride oxide, silicon oxide, or a combination thereof.

The oxygen source gas may selectively permeate into the second material layers 42 by using the reaction rate difference as described above. An oxygen source gas permeation rate of the second material layers 42 may be higher than an oxygen source gas permeation rate of the first material layers 41. Therefore, portions of the memory layer 43 that correspond to the second material layers 42 may be selectively oxidized, and thus, the first barrier patterns 46 may be formed. In addition, the oxidation thickness of a portion of the memory layer 43 to which a relatively large amount of oxygen source gas permeates and an oxidation thickness of a portion to which a relatively small amount of oxygen source gas permeates may differ. Therefore, each of the first barrier patterns 46 may have a C-shaped cross section.

During the oxidation process, the oxidation rate of the memory layer 43 may be adjusted according to a process condition. In addition, the depth at which the memory layer 43 is oxidized may be adjusted according to the oxidation rate. When the oxidation rate is relatively low, the memory layer 43 may be partially oxidized in thickness, and the memory layer 43 may remain between the first barrier patterns 46 and the tunnel insulating layer 49. When the oxidation rate is relatively high, the memory layer 43 may be entirely oxidized in thickness, and the memory layer 43 may not remain between the first barrier patterns 46 and the tunnel insulating layer 49.

Each of the first barrier patterns 46 may have a first sidewall SW1 that faces the memory layer 43 and a second sidewall SW2 that faces the blocking layer 47 or the second material layer 42. The first sidewall SW1 may include a curved surface. The second sidewall SW2 may be flat. The memory layer 43 may include grooves that are caused by the oxidation process, and the grooves may have a shape that surrounds the first barrier patterns 46.

Figure 4C:
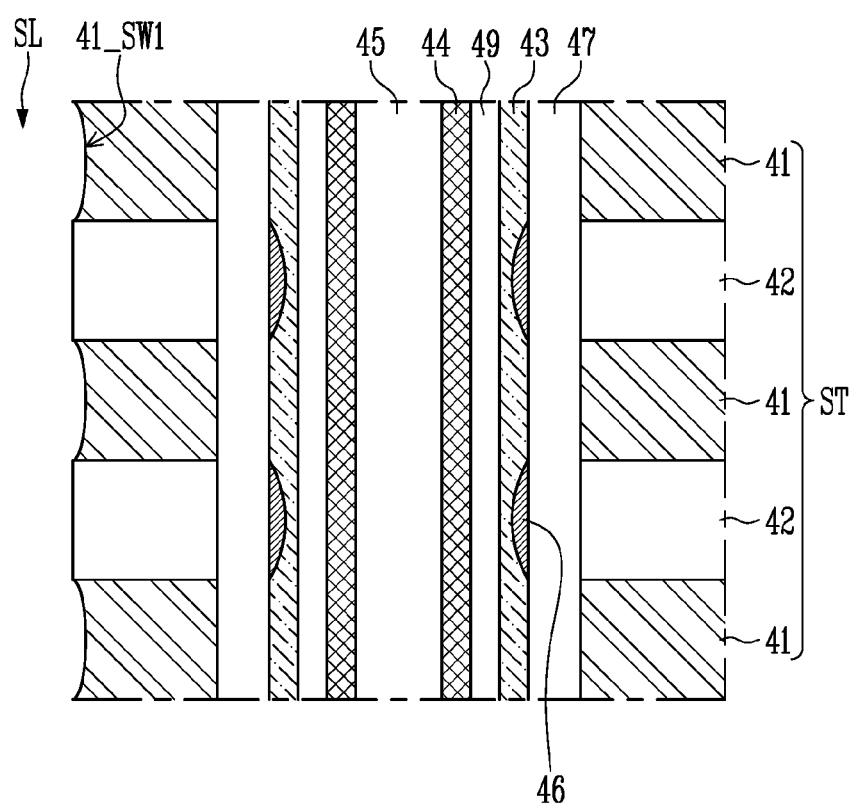

Referring to FIG. 4C, the second barrier patterns 48 may be removed. Therefore, the first sidewalls 41_SW1 of the first material layers 41 may be exposed. The first sidewalls 41_SW1 may include a curved surface. As an embodiment, the second barrier patterns 48 may be selectively etched. Alternatively, in a process of etching the second barrier patterns 48, the second material layers 42 that are exposed through the slit SL may be partially etched.

Figure 4D:
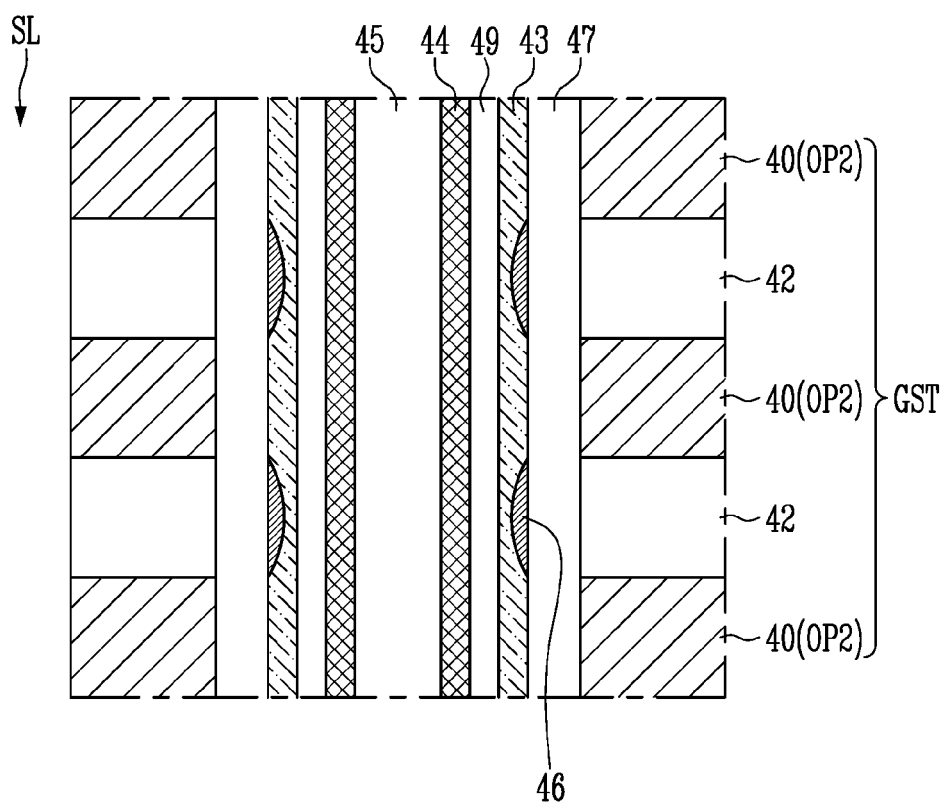

Referring to FIG. 4D, the first material layers 41 may be replaced with third material layers 40 through the slit SL. As an embodiment, after the first material layers 41 are removed to form the second openings OP2, conductive layers may be formed in the second openings OP2, respectively. As an embodiment, the first material layers 41 may be silicided through the slit SL. Thus, the gate structure GST with the second material layers 42 and the third material layers 40 that are alternately stacked is formed.

Subsequently, although not shown in the present drawing, a slit structure may be formed in the slit SL. The slit structure may include a conductive material, an insulating material, or a combination thereof. As an embodiment, the slit structure may include a contact plug and an insulating spacer that surrounds a sidewall of the contact plug.

According to the manufacturing method as described above, the first barrier patterns 46 may be formed without removing the second material layers 42. Before replacing the first material layers 41 with the third material layers 40, the first barrier patterns 46 may be formed by using an oxidation process. The charge transferal between the memory cells may be blocked or reduced by forming the first barrier patterns 46 to provide an energy barrier in the memory layer 43.

Figure 5A:
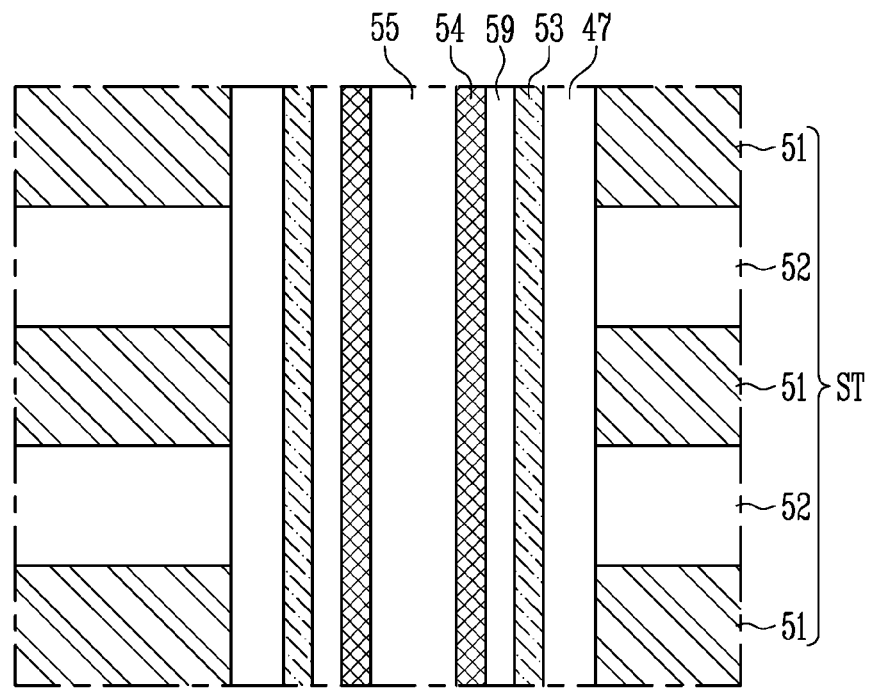
FIGS. 5A and 5B are diagrams illustrating a method of manufacturing a semiconductor device according to an embodiment of the present disclosure.
Figure 5B:
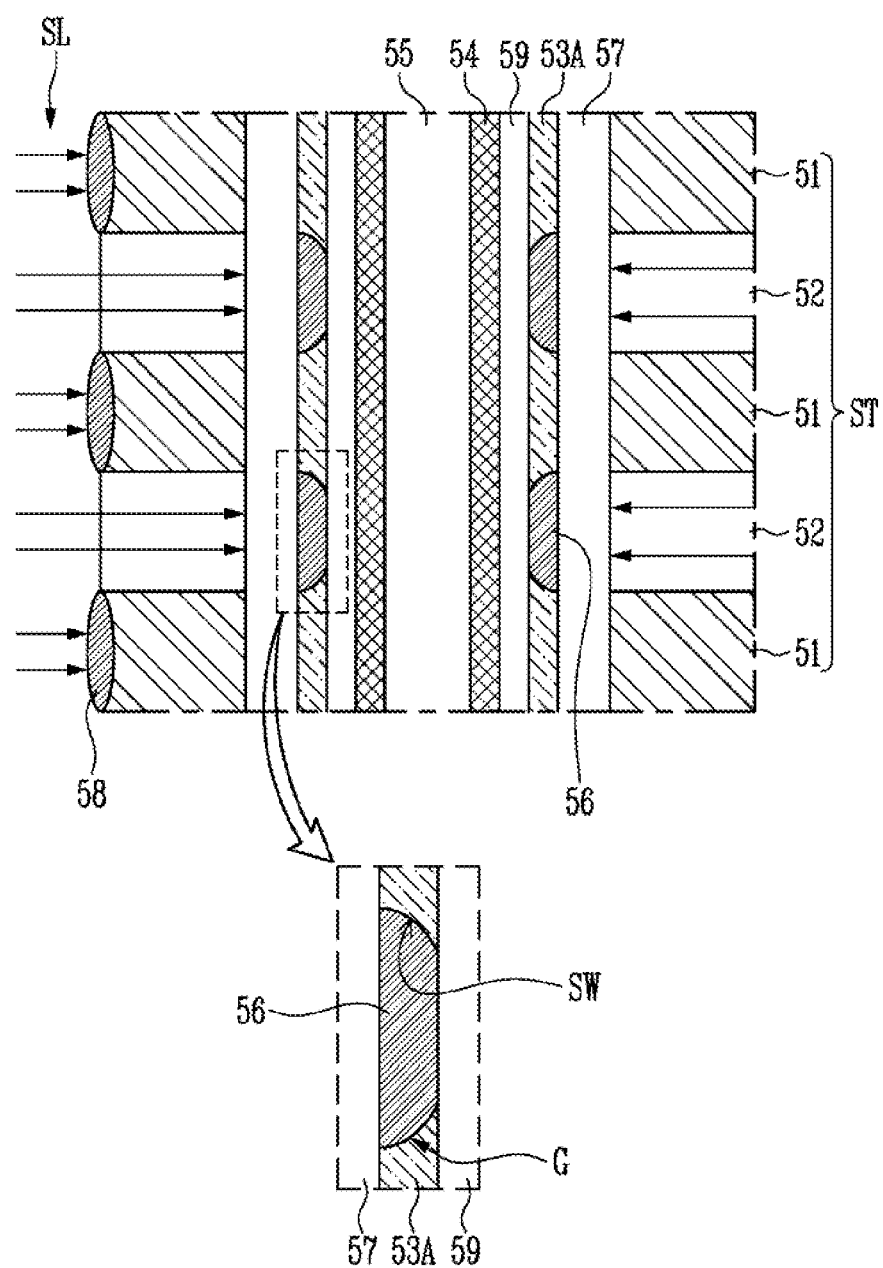

FIGS. 5A and 5B are diagrams illustrating a method of manufacturing a semiconductor device according to an embodiment of the present disclosure. Hereinafter, the content repetitive to the previously described content is omitted.

Referring to FIG. 5A, a stack ST with first material layers 51 and second material layers 52 that are alternately stacked is formed. Subsequently, an opening through the stack is formed. Subsequently, a blocking layer 57, a memory layer 53, a tunnel insulating layer 59, a channel layer 54, and an insulating core 55 may be formed in the opening or some thereof may be formed in the opening.

Referring to FIG. 5B, a slit SL that passes through the stack ST may be formed. Subsequently, first barrier patterns 56 may be formed by partially oxidizing the memory layer 53 by supplying an oxygen source gas through the slit SL. A portion of the memory layer 53 that corresponds to the second material layers 52 may be selectively oxidized.

During an oxidation process, the depth at which the memory layer 53 is oxidized may be adjusted by adjusting the oxidation rate. Therefore, the shapes of the first barrier patterns 56 and the remaining memory layer 53 may be adjusted. As an example, the first barrier patterns 56 and memory patterns 53A may be formed by entirely oxidizing, in thickness, the memory layer 53 at a high oxidation rate. The first barrier patterns 56 may be positioned to correspond with the second material layers 52, and the memory patterns 53A may be positioned to correspond with the first material layers 51. The memory patterns 53A may be separated from each other by the first barrier patterns 56. The first barrier patterns 56 may be in contact with a tunnel insulating layer 59 or a channel layer 54.

Each of the first barrier patterns 56 may include a sidewall SW that faces the memory patterns 53A. The sidewall SW may include a curved surface. The memory patterns 53A may include grooves G that are caused by the oxidation process, and the grooves G may have a shape that surrounds the first barrier patterns 56. The area at which the first barrier pattern 56 is in contact with the blocking layer 57 and the area at which the first barrier pattern 56 is in contact with the tunnel insulating layer 59 may be the same or may be different.

When forming the first barrier patterns 56, second barrier patterns 58 may be formed on a sidewall of the first material layers 51 exposed through the slit SL. The second barrier pattern 58 may be removed or may remain in a subsequent process.

According to the manufacturing method as described above, the first barrier patterns 56 may be formed by using the oxidation process without removing the second material layers 52. The charge transferal between the memory cells may be blocked or reduced by forming the first barrier patterns 56 to provide an energy barrier between the memory patterns 53A.

Figure 6:
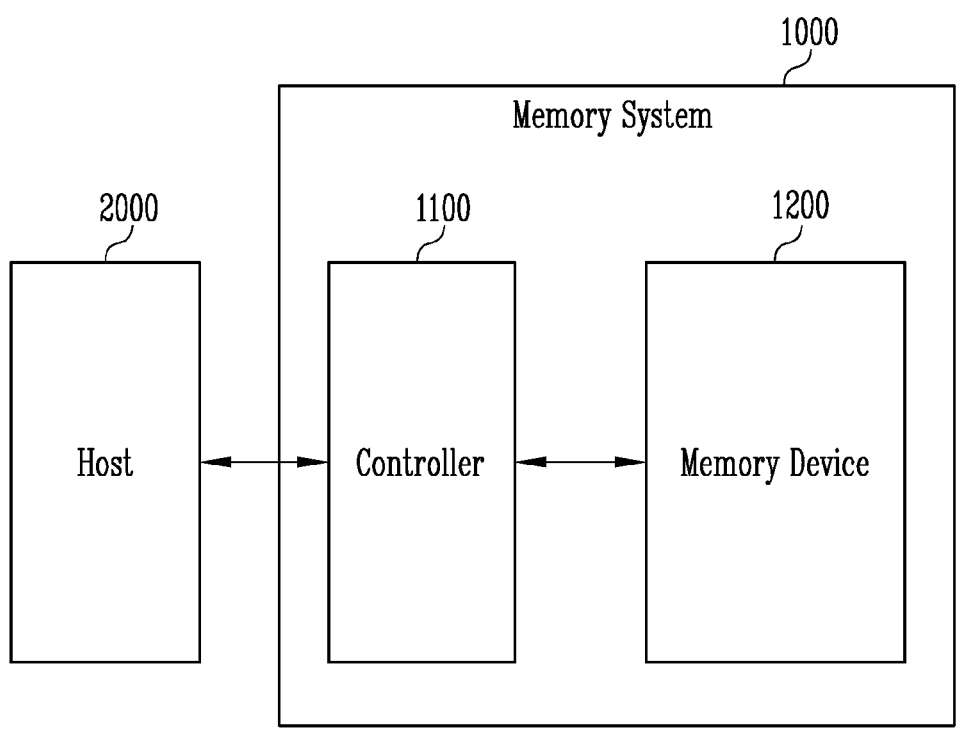
FIG. 6 is a diagram illustrating a memory system according to an embodiment of the present disclosure.

FIG. 6 is a diagram illustrating a memory system according to an embodiment of the present disclosure.

Referring to FIG. 6, the memory system 1000 may include a memory device 1200 in which data is stored, and a controller 1100 communicating between the memory device 1200 and a host 2000.

The host 2000 may be a device or system that stores data in the memory system 1000 or retrieves data from the memory system 1000. The host 2000 may generate requests for various operations and may output the generated requests to the memory system 1000. The requests may include a program request for a program operation, a read request for a read operation, an erase request for an erase operation, and the like. The host 2000 may communicate with the memory system 1000 through various interfaces such as peripheral component interconnect express PCIe), advanced technology attachment (ATA), serial ATA (SATA), parallel ATA (PATA), serial attached SCSI (SAS), nonvolatile memory express (NVMe), universal serial bus (USB), multi-media card (MMC), enhanced small disk interface (ESDI), or integrated drive electronics (IDE).

The host 2000 may include at least one of a computer, a portable digital device, a tablet, a digital camera, a digital audio player, a television, a wireless communication device, or a cellular phone, but embodiments of the present disclosure are not limited thereto.

The controller 1100 may generally control an operation of the memory system 1000. The controller 1100 may control the memory device 1200 according to the request of the host 2000. The controller 1100 may control the memory device 1200 so that the program operation, the read operation, the erase operation, and the like may be performed according to the request of the host 2000. Alternatively, the controller 1100 may perform a background operation or the like for improving performance of the memory system 1000 even though the request of the host 2000 does not exist.

The controller 1100 may transmit a control signal and a data signal to the memory device 1200 in order to control the operation of the memory device 1200. The control signal and the data signal may be transmitted to the memory device 1200 through different input/output lines. The data signal may include a command, an address, or data. The control signal may be used to divide a section in which the data signal is input.

The memory device 1200 may perform the program operation, the read operation, the erase operation, and the like under control of the controller 1100. The memory device 1200 may be implemented with a volatile memory device in which stored data is destroyed when power supply is cut off, or a nonvolatile memory device in which stored data is maintained even though power supply is cut off. The memory device 1200 may be the semiconductor device with the structure described above with reference to FIGS. 1A to 2B. The memory device 1200 may be the semiconductor device manufactured by the manufacturing method described above with reference to FIGS. 4A to 5B. As an embodiment, the semiconductor memory device may include a gate structure including alternately stacked conductive layers and insulating layers, a channel layer passing through the gate structure, a memory layer positioned between the channel layer and the conductive layers, and barrier patterns positioned between the channel layer and the insulating layers and separated from each other by the memory layer, and each of the barrier patterns may include a sidewall facing the memory layer, and the sidewall includes a curved surface.

Figure 7:
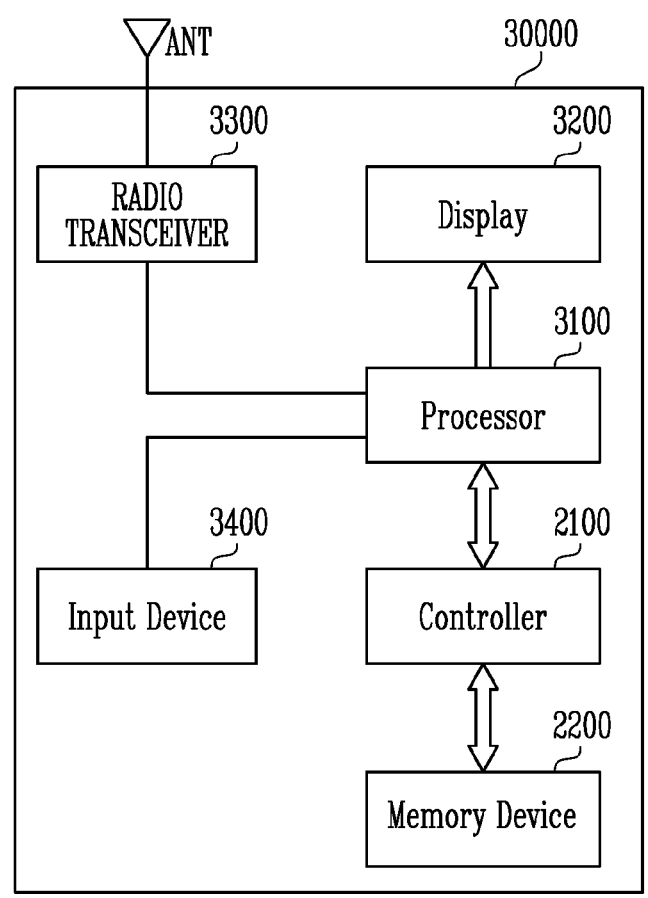
FIG. 7 is a diagram illustrating a memory system according to an embodiment of the present disclosure.

FIG. 7 is a diagram illustrating a memory system according to an embodiment of the present disclosure.

Referring to FIG. 7, the memory system 30000 may be implemented as a cellular phone, a smart phone, a tablet, a personal computer (PC), a personal digital assistant (PDA), or a wireless communication device. The memory system 30000 may include a memory device 2200 and a controller 2100 that is capable of controlling an operation of the memory device 2200.

The controller 2100 may control a data access operation, for example, a program operation, an erase operation, a read operation, or the like, of the memory device 2200 under control of a processor 3100.

Data that is programmed in the memory device 2200 may be output through a display 3200 under the control of the controller 2100.

A radio transceiver 3300 may transmit and receive a radio signal through an antenna ANT. For example, the radio transceiver 3300 may convert a radio signal that is received through the antenna ANT into a signal that may be processed by the processor 3100. Therefore, the processor 3100 may process the signal that is output from the radio transceiver 3300 and transmit the processed signal to the controller 2100 or the display 3200. The controller 2100 may transmit the signal that is processed by the processor 3100 to the memory device 2200. In addition, the radio transceiver 3300 may convert a signal that is output from the processor 3100 into a radio signal, and output the converted radio signal to an external device through the antenna ANT. An input device 3400 may be a device that is capable of inputting a control signal for controlling the operation of the processor 3100 or data to be processed by the processor 3100. The input device 3400 may be implemented as a pointing device, such as a touch pad or a computer mouse, a keypad, or a keyboard. The processor 3100 may control an operation of the display 3200 so that data that is output from the controller 2100, data that is output from the radio transceiver 3300, or data that is output from the input device 3400 is output through the display 3200.

According to an embodiment, the controller 2100 that is capable of controlling the operation of memory device 2200 may be implemented as a part of the processor 3100 and may be implemented as a chip that is separate from the processor 3100.

Figure 8:
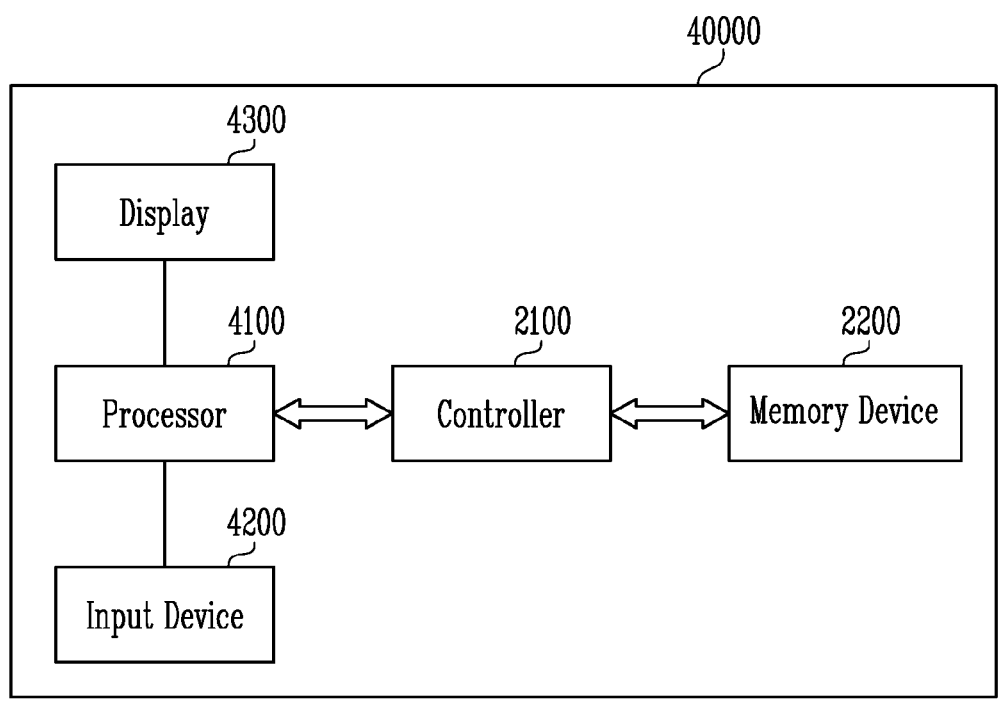
FIG. 8 is a diagram illustrating a memory system according to an embodiment of the present disclosure.

FIG. 8 is a diagram illustrating a memory system according to an embodiment of the present disclosure.

Referring to FIG. 8, the memory system 40000 may be implemented as a personal computer (PC), a tablet, a netbook, an e-reader, a personal digital assistant (PDA), a portable multimedia player (PMP), an MP3 player, or an MP4 player.

The memory system 40000 may include the memory device 2200 and the controller 2100 that is capable of controlling a data process operation of the memory device 2200. A processor 4100 may output data stored in the memory device 2200 through a display 4300, according to data input through an input device 4200. For example, the input device 4200 may be implemented as a point device such as a touch pad or a computer mouse, a keypad, or a keyboard.

The processor 4100 may control the overall operation of the memory system 40000 and control the operation of the controller 2100. According to an embodiment, the controller 2100 that is capable of controlling the operation of memory device 2200 may be implemented as a part of the processor 4100 or may be implemented as a chip that is separate from the processor 4100.

Figure 9:
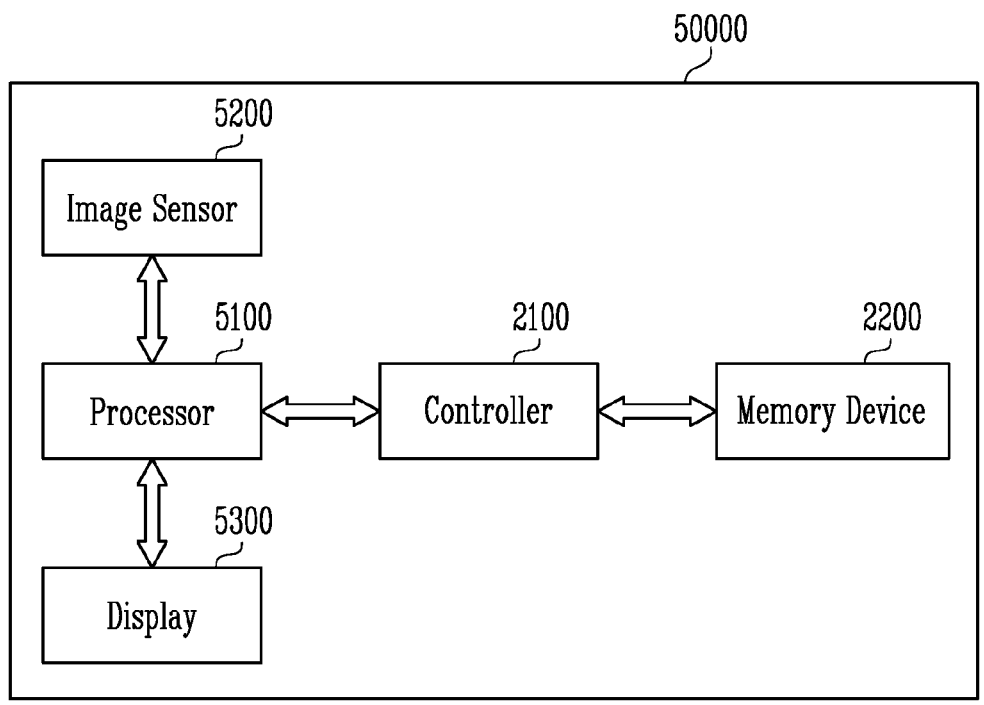
FIG. 9 is a diagram illustrating a memory system according to an embodiment of the present disclosure.

FIG. 9 is a diagram illustrating a memory system according to an embodiment of the present disclosure.

Referring to FIG. 9, the memory system 50000 may be implemented as an image processing device, for example, a digital camera, a portable phone that is provided with a digital camera, a smart phone that is provided with a digital camera, or a tablet that is provided with a digital camera.

The memory system 50000 includes the memory device 2200 and the controller 2100 that is capable of controlling a data process operation, for example, a program operation, an erase operation, or a read operation, of the memory device 2200.

An image sensor 5200 of the memory system 50000 may convert an optical image into digital signals. The converted digital signals may be transmitted to a processor 5100 or the controller 2100. Under the control of the processor 5100, the converted digital signals may be output through a display 5300 or stored in the memory device 2200 through the controller 2100. In addition, data that is stored in the memory device 2200 may be output through the display 5300 under the control of the processor 5100 or the controller 2100.

According to an embodiment, the controller 2100 that is capable of controlling the operation of memory device 2200 may be implemented as a part of the processor 5100 or may be implemented as a chip that is separate from the processor 5100.

Figure 10:
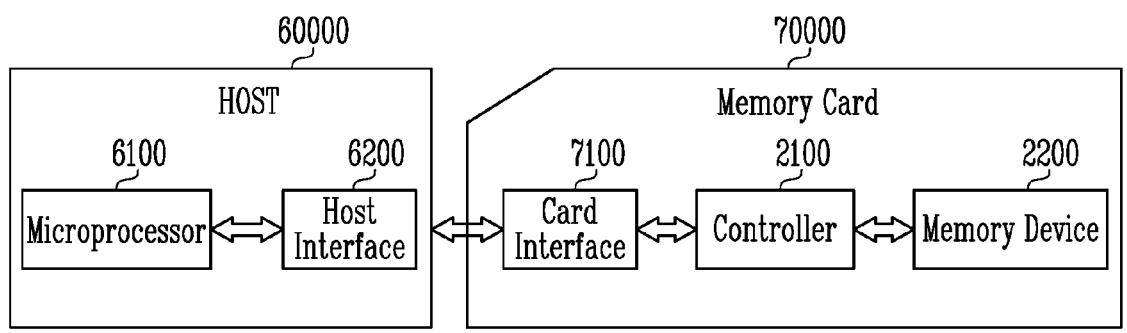
FIG. 10 is a diagram illustrating a memory system according to an embodiment of the present disclosure.

FIG. 10 is a diagram illustrating a memory system according to an embodiment of the present disclosure.

Referring to FIG. 10, the memory system 70000 may be implemented as a memory card or a smart card. The memory system 70000 may include the memory device 2200, the controller 2100, and a card interface 7100.

The controller 2100 may control the data exchange between the memory device 2200 and the card interface 7100. According to an embodiment, the card interface 7100 may be a secure digital (SD) card interface or a multi-media card (MMC) interface, but is not limited thereto.

The card interface 7100 may interface the data exchange between a host 60000 and the controller 2100 according to a protocol of the host 60000. According to an embodiment, the card interface 7100 may support a universal serial bus (USB) protocol, and an interchip (IC)-USB protocol. Here, the card interface 7100 may refer to hardware that is capable of supporting a protocol that is used by the host 60000, software that is installed in the hardware, or a signal transmission method.

When the memory system 70000 is connected to a host interface 6200 of the host 60000 such as a PC, a tablet, a digital camera, a digital audio player, a mobile phone, a console video game hardware, or a digital set-top box, the host interface 6200 may perform data communication with the memory device 2200 through the card interface 7100 and the controller 2100 under control of a microprocessor 6100.

What is claimed is:

1. A semiconductor device comprising:
   a gate structure with alternately stacked conductive layers and insulating layers;
   a channel layer passing through the gate structure;
   a memory layer positioned between the channel layer and the conductive layers; and
   barrier patterns positioned between the channel layer and the insulating layers and separated from each other by the memory layer,
   wherein each of the barrier patterns includes a sidewall facing the memory layer, and the sidewall includes a curved surface.

2. The semiconductor device of claim 1, wherein the memory layer is extended between the channel layer and the barrier patterns.

3. The semiconductor device of claim 1, wherein the memory layer includes memory patterns that are separated from each other by the barrier patterns.

4. The semiconductor device of claim 1, wherein, in each of the barrier patterns, an area that faces the insulating layers and an area that faces the channel layer are different.

5. The semiconductor device of claim 1, wherein the barrier patterns include silicon nitride oxide, silicon oxide, or a combination thereof.

6. A semiconductor device comprising:
   a gate structure with alternately stacked conductive layers and insulating layers;
   a channel layer passing through the gate structure;
   a tunnel insulating layer surrounding the channel layer;
   a memory layer surrounding the tunnel insulating layer;
   a blocking layer surrounding the memory layer; and
   barrier patterns between the tunnel insulating layer and the insulating layers and separated from each other by the memory layer,
   wherein each of the barrier patterns includes a first sidewall facing the memory layer, and the first sidewall is not straight.

* * * * *